United States Patent
Vaara et al.

(10) Patent No.: US 7,026,874 B2
(45) Date of Patent: Apr. 11, 2006

(54) METHODS AND APPARATUS FOR IMPROVING THE OPERATION OF A VARIABLE GAIN AMPLIFIER (VGA)

(75) Inventors: Sami Vaara, Turku (FI); Sami Vilhonen, Turku (FI)

(73) Assignee: Nokia Corporation, Espoo (FI)

( * ) Notice: Subject to any disclaimer, the term of this patent is extended or adjusted under 35 U.S.C. 154(b) by 440 days.

(21) Appl. No.: 10/372,514

(22) Filed: Feb. 24, 2003

(65) Prior Publication Data

US 2004/0166821 A1  Aug. 26, 2004

(51) Int. Cl.
  *H03F 3/45* (2006.01)
(52) U.S. Cl. .............................. 330/256; 330/289
(58) Field of Classification Search ............... 330/256, 330/289, 259, 260, 261
  See application file for complete search history.

(56) References Cited

U.S. PATENT DOCUMENTS

| | | | |
|---|---|---|---|
| 5,471,654 A * | 11/1995 | Okazaki et al. ............ 455/126 |
| 5,548,616 A | 8/1996 | Mucke et al. ............... 375/295 |
| 5,752,170 A | 5/1998 | Clifford ....................... 455/126 |
| 5,752,172 A | 5/1998 | Matero ......................... 455/127 |
| 5,884,149 A | 3/1999 | Jaakola ........................ 455/103 |
| 5,900,782 A * | 5/1999 | Igarashi et al. ............. 330/254 |
| 6,009,129 A | 12/1999 | Kennedy et al. ............ 375/346 |
| 6,060,950 A | 5/2000 | Groe ............................ 330/279 |
| 6,084,471 A | 7/2000 | Ruth, Jr. et al. ............ 330/254 |
| 6,167,273 A | 12/2000 | Mandyam .................... 455/450 |
| 6,178,313 B1 | 1/2001 | Mages et al. ................ 455/127 |
| 6,317,589 B1 | 11/2001 | Nash ......................... 455/245.2 |
| 6,369,618 B1 * | 4/2002 | Bloodworth et al. ....... 327/103 |
| 6,370,358 B1 | 4/2002 | Liimatainen ................ 455/67.1 |

* cited by examiner

*Primary Examiner*—Henry Choe
(74) *Attorney, Agent, or Firm*—Harrington & Smith, LLP

(57) ABSTRACT

Disclosed is an RF transmitter circuit (10), as well as a method for operating the circuit. The RF transmitter circuit includes a VGA (20), that includes circuitry for generating a feedback signal, and a temperature compensation block (18) having an input coupled to a gain control signal and an output coupled to an input of the VGA for providing to the VGA a compensated gain control signal. The temperature compensation block further includes a bias input that receives the VGA feedback signal. The VGA feedback signal operates to modify the gain control signal to reduce an amount of variability in a VGA gain slope over a range of VGA output power.

25 Claims, 9 Drawing Sheets

US 7,026,874 B2

METHODS AND APPARATUS FOR IMPROVING THE OPERATION OF A VARIABLE GAIN AMPLIFIER (VGA)

TECHNICAL FIELD

These teachings relate generally to radio frequency (RF) circuitry and, more specifically, to variable gain amplifiers (VGAs) having temperature compensation circuitry, such as VGAs used in transmitters of portable radiocommunication terminals, also referred to herein as mobile stations.

BACKGROUND

Referring to FIG. 1A, the basic architecture of an RF transmitter 1 includes a digital-to-analog converter (DAC) 2, a filter 3, a mixer (up-conversion to the transmitted frequency) 4, a gain control circuit (Variable Gain Amplifier or VGA) 5 and a power amplifier 6 having an output coupled to a transmit antenna 7. The VGA 5 is used to adjust the output power of the transmitter 1 to the desired level. Referring also to FIG. 1B, bipolar differential pairs, also referred to as a quad 5A, is used as a part of the VGA 5. A DC control voltage (gain control) is applied through a temperature compensation block 5B and causes the gain of the VGA 5 to change. Current is steered between the bipolar junction transistors (bjts) of the quad 5A, and can be considered to be divided between a first desired or "wanted" current branch and a second un-used or "waste" current branch.

In general, a high dynamic range of the VGA 5 is achieved by the current steering in the bjt differential pair or quad 5A. However, the current steering performance of the quad 5A is very much temperature dependent, and therefore the temperature compensation circuit 5B is required for driving the quad 5A.

It has been observed that the accuracy of the temperature compensation block 5B degrades when operating at a low VGA output power, i.e., when operating with a low value of the gain control voltage. In the absence of some type of calibration procedure it becomes necessary to reserve additional margin in the gain control circuitry to ensure a desired VGA dynamic range, as the gain slope can exhibit a considerable amount of variation, as shown in FIG. 2A.

As one non-limiting example, a wideband code division, multiple access (WCDMA) transmitter system requires a large dynamic range in the transmitter signal path. However, the gain variations can result in a reduction of the dynamic range, and/or in experiencing different performance during dynamic conditions such as ramp-up of the power during transmission. In addition, a WCDMA transmitter 1 can be required to be on for long period of time, which may tend to increase the severity of temperature-related performance problems.

The circuitry shown in FIGS. 1A and 1B is typically integrated into one or more integrated circuits. As such, and due to largely unavoidable variations in integrated circuit process parameters, the output power of different integrated circuits are not same at the same value of the control voltage (or current). As can be appreciated, a requirement to design additional margin into the gain control circuitry can result in an undesirable increase in both cost and circuit complexity.

Reference can be had to the following commonly assigned U.S. patents for descriptions of various prior art VGA circuits and techniques, used in RF transmitters as well as in RF receivers: U.S. Pat. No. 5,548,616, L. Mucke et al.; U.S. Pat. No. 5,752,172, J. Matero; U.S. Pat. No. 5,752,170, P. Clifford; U.S. Pat. No. 5,884,149, M. Jaakola; U.S. Pat. No. 6,009,129, T. Kenney et al; U.S. Pat. No. 6,060,950, J. Groe; U.S. Pat. No. 6,167,273, G. Mandyam; U.S. Pat. No. 6,084,471, R. Ruth, Jr. et al.; U.S. Pat. No. 6,178,313 B1, P. Mages et al.; U.S. Pat. No. 6,317,589 B1, A. Nash and U.S. Pat. No. 6,370,358 B2, J. Liimatainen.

SUMMARY OF THE PREFERRED EMBODIMENTS

The foregoing and other problems are overcome, and other advantages are realized, in accordance with the presently preferred embodiments of these teachings.

Disclosed is an RF transmitter circuit, as well as a method for operating the circuit. The RF transmitter circuit includes a VGA that includes circuitry for generating a feedback signal and a temperature compensation block having an input coupled to a gain control signal and an output coupled to an input of the VGA for providing to the VGA a compensated gain control signal. The temperature compensation block further includes a bias input that receives the VGA feedback signal. The VGA feedback signal operates to modify the gain control signal to reduce an amount of variability in a VGA gain slope over a range of VGA output power.

In one embodiment the feedback signal is generated continuously based on parameters established during a calibration procedure, while in another embodiment the feedback signal is generated periodically based on parameters established during a calibration procedure. In the latter case the RF transmitter circuit further includes means for storing the feedback signal for use during operation of the VGA, such as during burst-mode operation. In some embodiments the feedback signal is generated by a transistor pair that operates in parallel with a VGA transistor quad. In some embodiments the transistor pair is driven by the same input signal circuit that drives the transistor quad, while in others the transistor pair is driven by a different input signal circuit than an input signal circuit that drives the transistor quad. In certain embodiments a first one of the transistors of the transistor pair has a load resistance given by R, a second one of the transistors of the transistor pair has a load resistance given by xR, and during a calibration procedure a signal is varied until the voltage difference between R and xR is substantially zero for indicating that the output power is x-times smaller than a maximum VGA output power.

In some embodiments of this invention the gain control signal is scaled by an amount specified by the feedback signal, and a calibration reference signal is also scaled by an amount specified by the feedback signal.

In yet another embodiment the feedback signal is a signal generated from a sampled waste branch current of a VGA transistor quad.

BRIEF DESCRIPTION OF THE DRAWINGS

The foregoing and other aspects of these teachings are made more evident in the following Detailed Description of the Preferred Embodiments, when read in conjunction with the attached Drawing Figures, wherein.

DETAILED DESCRIPTION OF THE PREFERRED EMBODIMENTS

Figure 3:
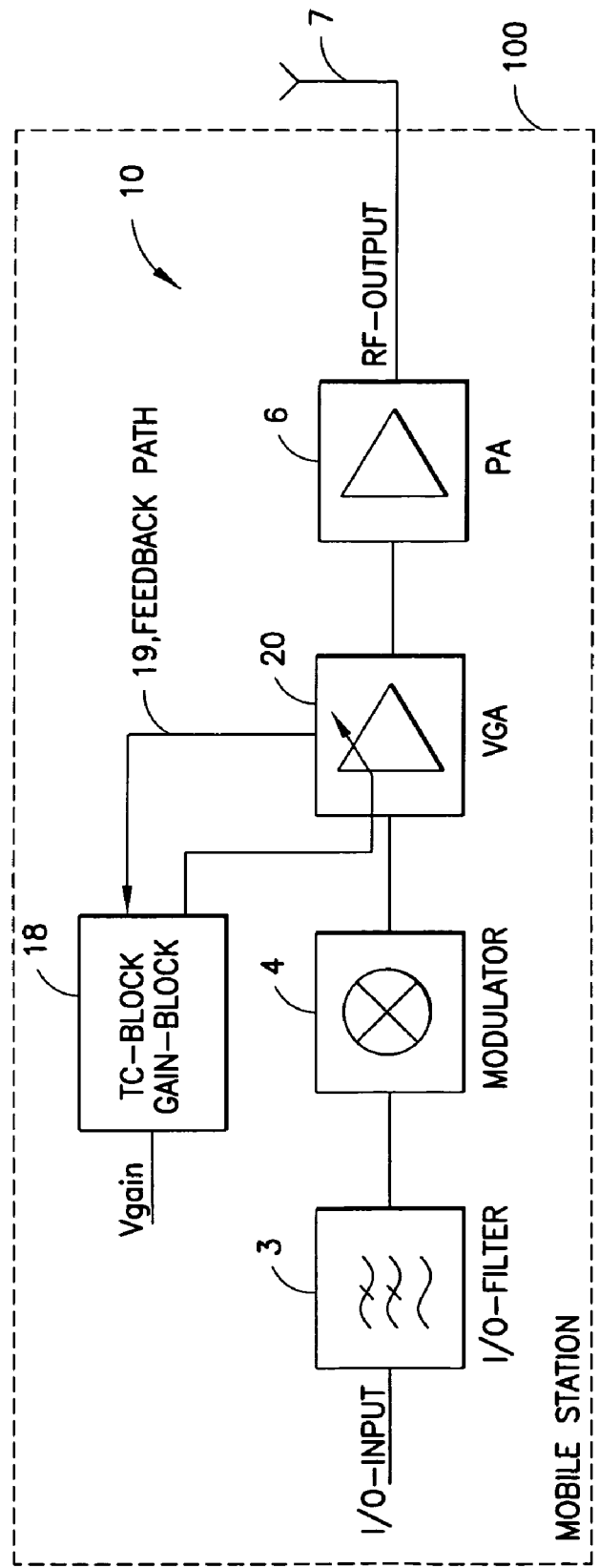
FIG. 3 is simplified block diagram of a transmitter that is suitable for use in a mobile station, such as a cellular telephone.

FIG. 3 is a block diagram of a non-limiting embodiment of a transmitter 10 that is suitable for use in practicing this invention. The transmitter 10, in the presently preferred embodiment of this invention, forms a part of a mobile station 100, such as a cellular telephone or a personal communicator. The block diagram of FIG. 3 is provided so as to place the circuits and methods of this invention into a technological context to facilitate the description thereof, and is thus not to be construed in a limiting sense upon the practice of this invention.

Figure 1A:
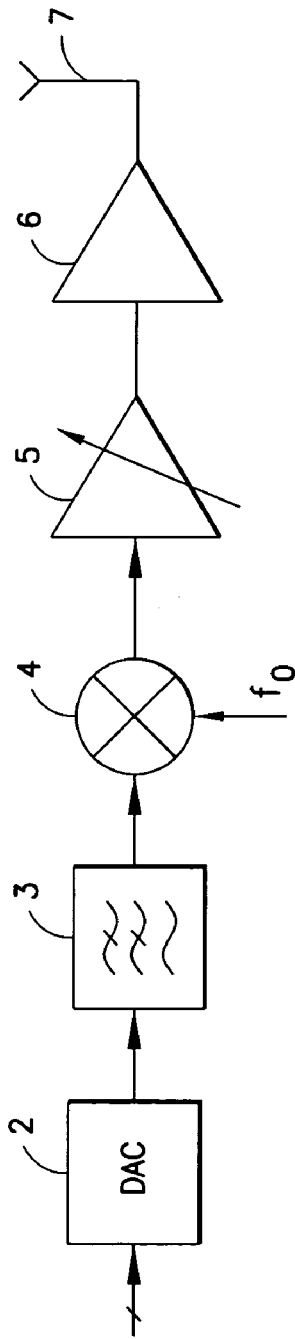
FIG. 1A is simplified block diagram of a prior art transmitter that is suitable for use in a mobile station, such as a cellular telephone.

An Inphase/Quadrature (I/Q) input, such as one provided from a DAC similar to the one shown in FIG. 1A, is applied to a lowpass filter 3. The filtered input is applied to a mixer that functions as a modulator 4 of the transmitted frequency. The modulated RF output is then applied to a VGA 20 that is controlled by a voltage gain (Vgain) signal via a temperature compensation (TC) gain block 18. The output of the VGA 20 is applied to a power amplifier (PA) 6, and the output of the power amplifier 6 is applied to the antenna 7.

In accordance with an aspect of this invention, there is a feedback path 19 between the VGA 20 and the TC gain block 18.

Figure 4A:
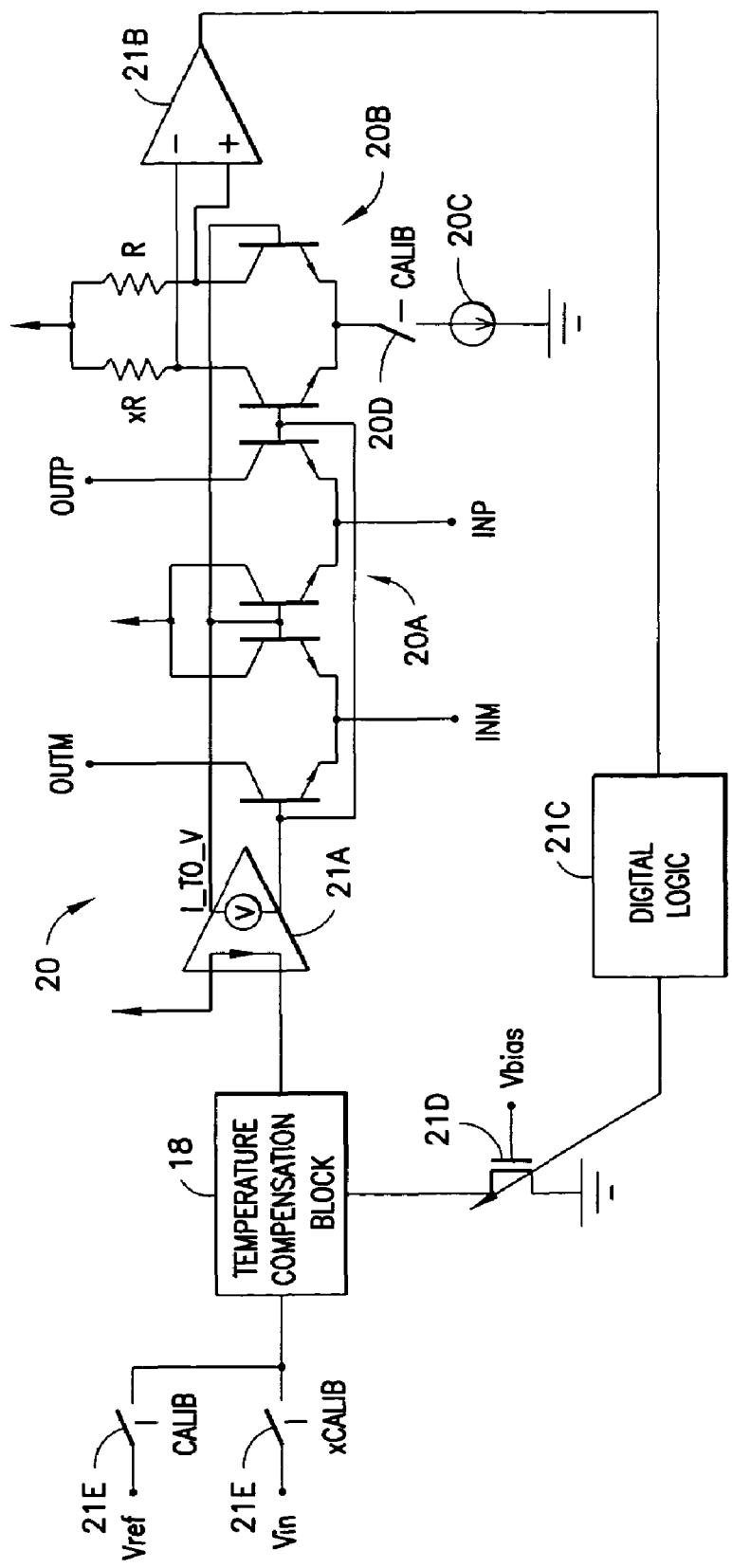
FIG. 4A is a diagram of circuitry for implementing the VGA calibration procedure in accordance with a first embodiment of this invention.

A first embodiment of this invention is shown in FIG. 4A. This embodiment of the invention provides an improved accuracy for the temperature compensation block 18 by the use of feedback. Before transmission a calibration of the VGA 20 ensures a required dynamic range and a desired gain slope. The calibration is performed by using a DC current of an additional calibration bjt transistor pair, and it is preferably performed on-chip.

After the calibration procedure the gain slope is substantially constant, and the gain control range is better characterized. One result is that for a given value of the control voltage (or current) the transmitter output power is substantially the same from chip-to-chip.

Figure 6:
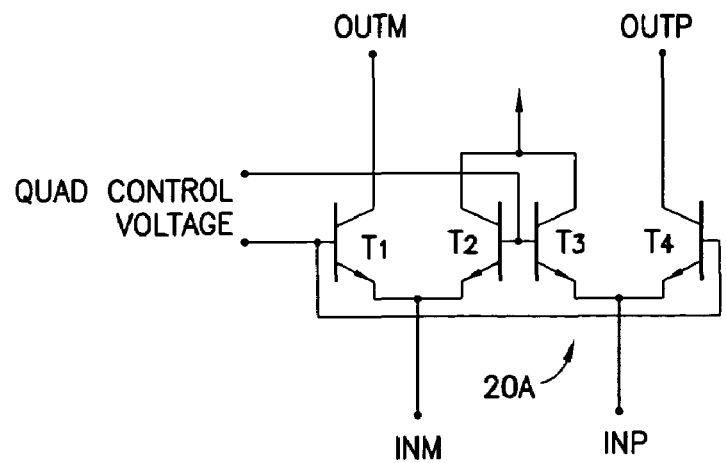
FIG. 6 shows in greater detail the VGA quad that also illustrated in FIGS. 4 and 5.

In FIG. 4A the VGA 20 includes a normal, operational quad 20A having inputs INM, INP and outputs OUTM and OUTP. Referring also to FIG. 6, the bases of T1, T4 and T2, T3 are driven by differential signals referred to as a quad control voltage. In the embodiment of FIG. 4A the input to the VGA 20 is made through a current-to-voltage converter 21 having differential outputs for driving quad 20A as well as the calibration-related transistor pair 20B. The calibration bjt pair 20B is switchably coupled to a current source 20C through a calibration switch 20D. Before calibration a reference voltage, Vref, is connected to the gain input of the temperature compensation block 18 via upper switch 21E, i.e., the VGA 20 is switched into the calibration mode (and the normal input signal Vin is disconnected by the lower switch contacts). The feedback path 19 is implemented with bjt pair load resistors R and xR, differential amplifier 21B, digital logic 21C and a variable bias source 21D for the temperature compensation block 18. The signal Vref is held constant, and the current of the variable boas source 21D is varied by changing the digital signal output from the digital logic block 21C until the voltage difference between the resistors R and xR is zero, indicating that the output power is x-times smaller than the maximum output power. If, for example, the ratio of the resistors (x) is 40 dB, then the feedback path 19 adjusts the transmitter 10 so that with an input voltage of Vref the output power is always 40 dB (the ratio of the resistors (x)) lower than the maximum output power. During transmission, where switches 21E couple Vin to the input of the temperature compensation block 18, the calibration circuitry may be turned off to save power, such as by opening switch 20D, and the correct value of calibration is stored by the digitally-switched transistor(s) 21D.

Figure 4B:
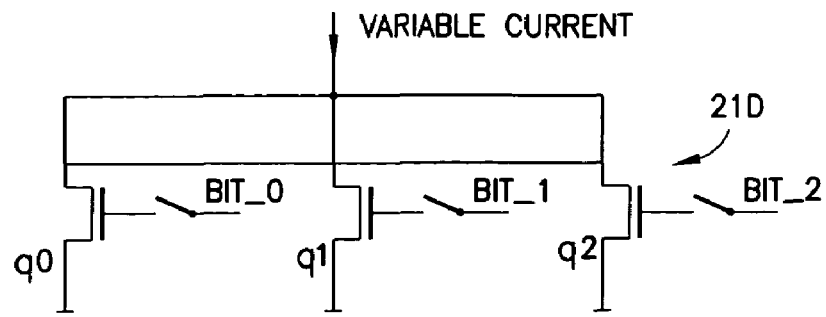
FIG. 4B is a schematic diagram that shows an embodiment of the variable bias source block illustrated in FIG. 4A.

FIG. 4B is a schematic diagram that shows an embodiment of the variable bias source 21D illustrated in FIG. 4A. In this non-limiting example the digital word output from digital logic block 21C is assumed to be three bits in width (bit_0, bit_1, bit_2), and each bit drives a mosfet transistor q0–q2. The bits 0–2 control the on/off state of the transistors q0–q2, respectively, and thus the amount of current (variable current) flowing through the temperature compensation block 18.

In the embodiment of FIG. 4A the operational amplifier 21B functions as a comparator. In the calibration mode the digital logic block 21C, which may be implemented as a counter that counts an input clock signal (not shown), begins to increase the value of the digital word output (bits 0–2), which causes the bias current of the variable bias source 21D to increase. This changes the gain of the VGA 20, and the voltage difference between xR and R decreases until the comparator 21B changes state. At this point the counter value of the digital logic block 21C is held, maintaining the current values of bits 0–2, and the correct value of bias current established by variable bias source 21D is also maintained.

Figure 2B:
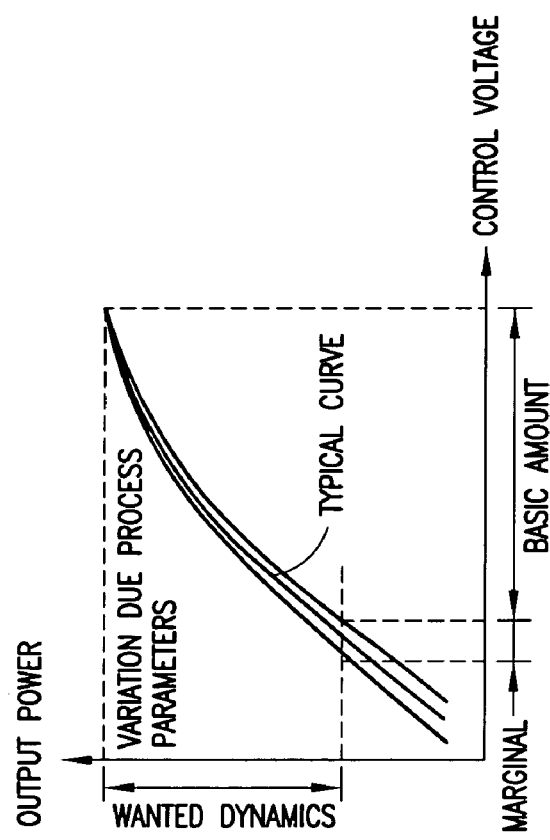
FIGS. 2A and 2B are graphs that are useful for showing the effect of VGA calibration on the gain slope and gain control range.
Figure 2A:
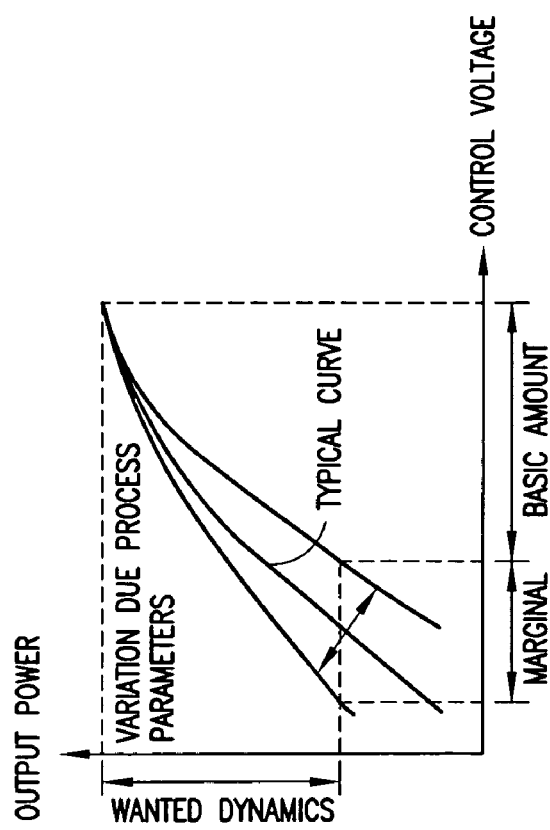

FIG. 2B shows the improvement in the variability of the gain slope that may be achieved after calibration in accordance with this invention. Note that after the calibration procedure is performed the gain control margin can be made smaller, and the control range can be used more efficiently, as the gain slope is substantially constant over the range of output power.

Figure 1B:
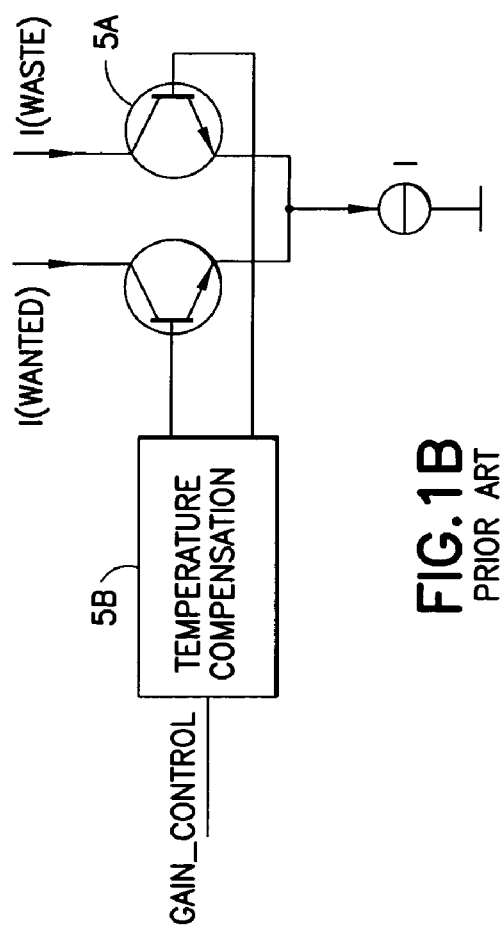
FIG. 1B is a simplified schematic diagram of a prior art BJT differential amplifier, or quad, having a gain control input applied through a temperature compensation block, the quad forming a part of the VGA shown in FIG. 1A.
Figure 5:
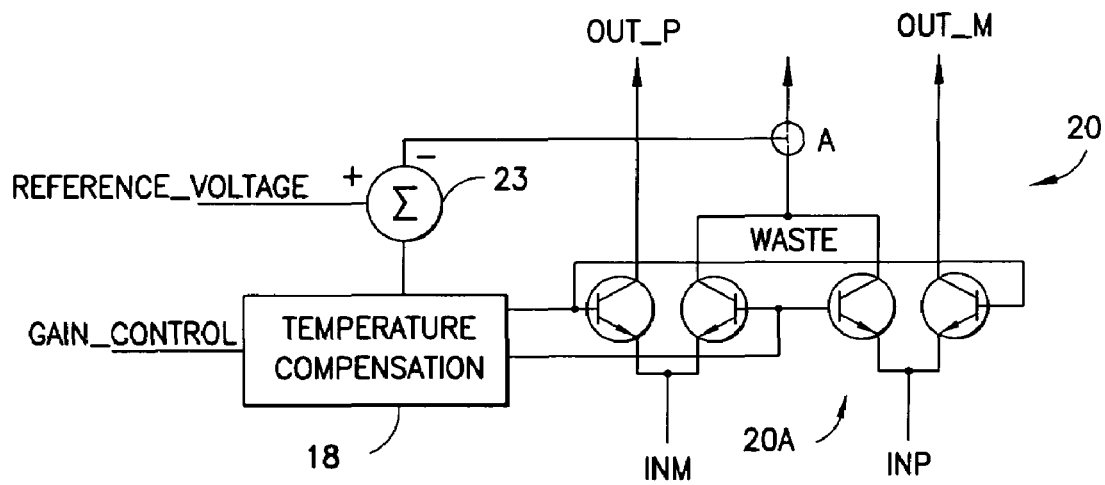
FIG. 5 is a diagram of circuitry for implementing the VGA calibration procedure in accordance with a second embodiment of this invention.

FIG. 5 shows another embodiment of calibration circuitry for the VGA 20 that uses the quad waste branch current (see FIG. 1B) for the calibration. As with the embodiment of FIG. 4A, after the calibration procedure the gain slope is substantially constant, the gain control range is better characterized, and more uniformity exists between integrated circuits.

In the embodiment of FIG. 5, and at the start of calibration, the gain control voltage to the temperature compensation block 18 is set to a predetermined value. The calibration is then performed by taking a sample of the current of the waste branch at current sampling node A, and adjusting a reference voltage to obtain a zero output from a differencing block 23 in a closed-loop manner. The output of the differencing block 23 provides a bias to the temperature compensation block 18 that, in combination with the reference voltage, calibrates the VGA 20 for, by example, a minimum output power as in the embodiment of FIG. 4A. As should be apparent, a feedback path also exists in this embodiment; from the node A where the measurement of the waste current is made back to the differencing block 23 that provides a bias to the temperature compensation block 18.

Figure 7:
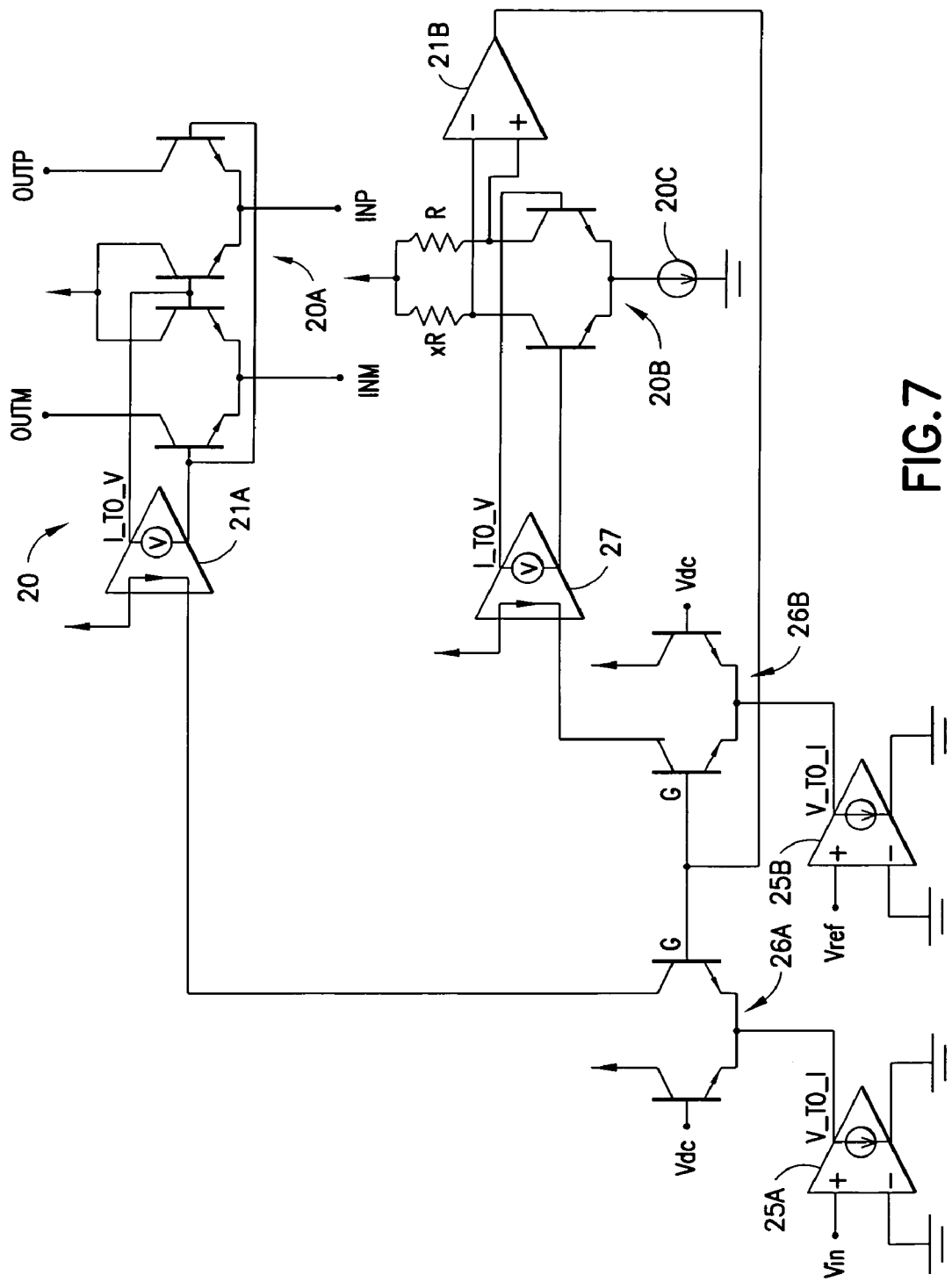
FIG. 7 is a diagram of circuitry for implementing the VGA calibration procedure in accordance with a third embodiment of this invention that provides continuous feedback.

Reference is now made to the embodiment of FIG. 7 for illustrating another embodiment of this invention. The VGA 20 quad pair 20A and the current-to-voltage converter 21A are as illustrated in FIG. 4A. In this embodiment the bjt pair 20B, having current source 20C, load resistors R and xR, and the output differential amplifier 21B are also provided as in FIG. 4A. However, in this embodiment the input signal Vin is applied through a volt-to-current converter 25A and attenuated by a bjt pair 26A before being applied to current-to-voltage converter 21A. The attenuation is accomplished by driving the base of the transistor of bjt pair 26A with the output of the feedback loop. The calibration reference voltage Vref is applied through a volt-to-current converter 25B and attenuated by a bjt pair 26B before being applied to current-to-voltage converter 27 that drives bjt pair 20B. The attenuation of the calibration current is accomplished identically to the attenuation of the input current by driving the base of the transistor of bjt pair 26B with the output of the feedback loop. A feedback path exists from the output of amplifier 21B to the bases of transistors in each of bjt pairs 26A, 26B. This arrangement causes the quad 20A output power, in dBm, to change linearly with linear changes in Vin. However this attenuation may not be constant if the temperature changes. This is compensated in FIG. 7 by Vref, which drives the equivalent calibration circuitry (components 25B, 26B, 27, etc.). In operation the voltage Vref is kept constant, and the feedback loop guarantees that the voltage difference between the resistors (R and xR) is zero, i.e., the current through the bjt pair 20 Bquad is distributed in accordance with the resistor ratio. If Vin is equal to Vref, then the output power is lower by the same amount, in dB, than the maximum output power, as establish by the resistor ratio x. The temperature variations of the VGA 20 are therefore compensated by using the "pseudo-VGA" (bjt pair 20B, and associated components 27 and 21B) that is connected in parallel with the actual VGA.

Figure 8:
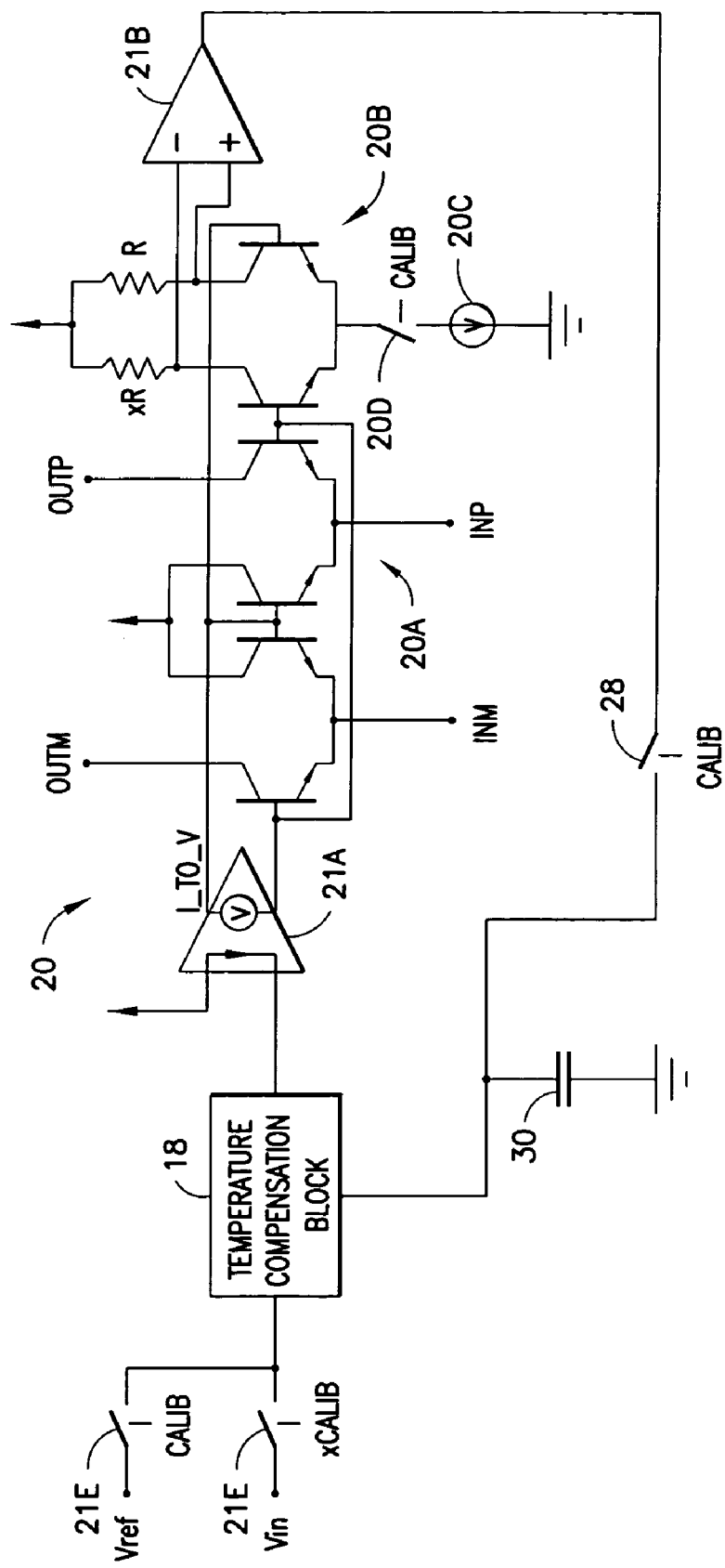
FIG. 8 is a diagram of circuitry for implementing the VGA calibration procedure in accordance with a fourth embodiment of this invention that provides sample-and-hold based feedback.
Figure 9:
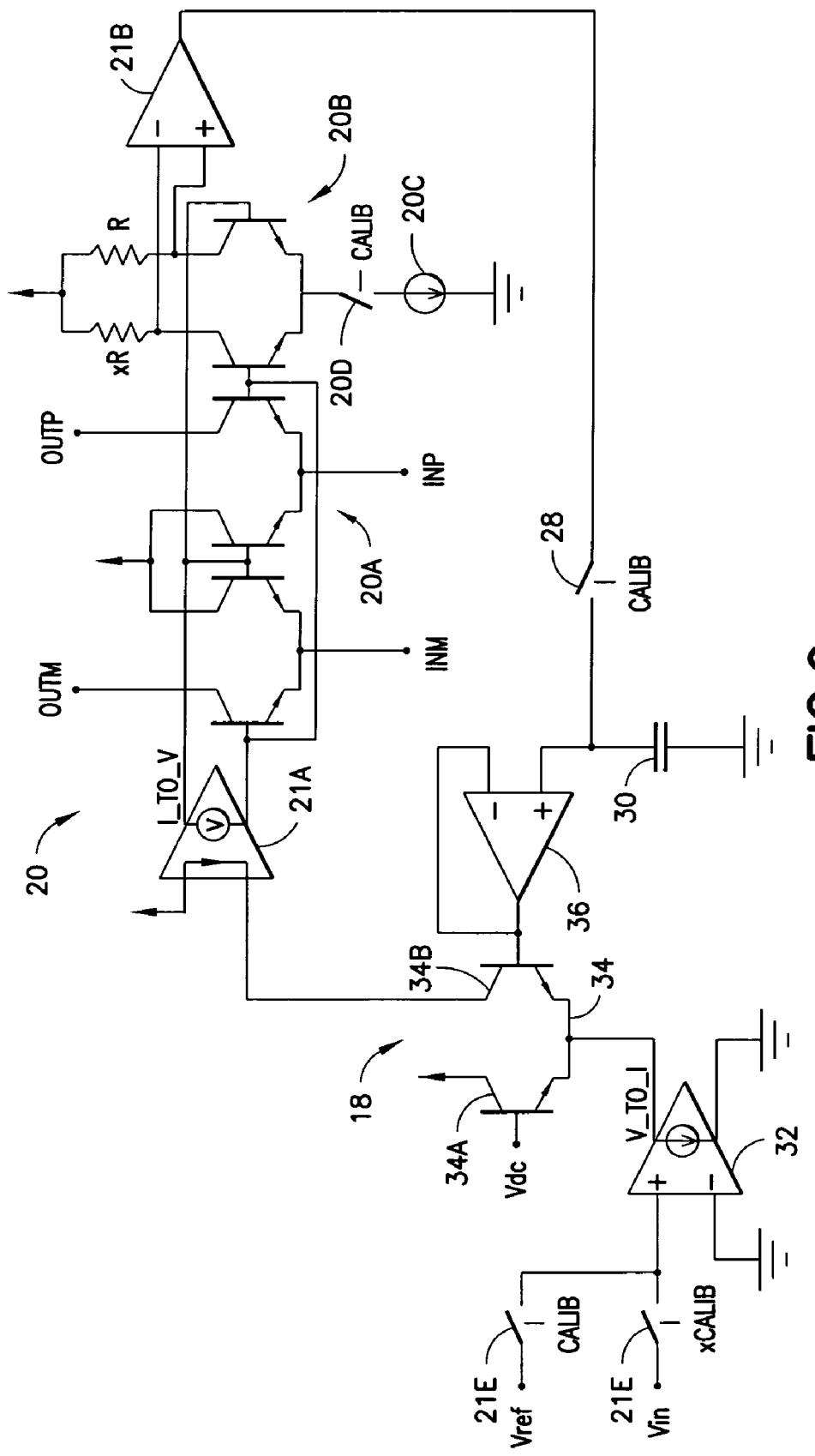
FIG. 9 is a diagram of circuitry for implementing the VGA calibration procedure in accordance with a fifth embodiment of this invention that also provides sample-and-hold based feedback.

FIGS. 8 and 9 show embodiments of yet another improved VGA 20. FIG. 8 is very similar to the embodiment of FIG. 4A, but differs in that the digital logic 21C and the variable bias source 21D are replaced by a calibration switch 28 and a capacitance 30. The switch 28 and capacitance 30 function in a manner analogous to a sample-and-hold circuit to store a calibration voltage value output from amplifier 21B during normal (non-calibration) operation. For a burst-type system (e.g., a GSM system) the capacitance 30 need only store the calibration voltage value for the duration of the burst, as re-calibration may be performed between bursts if desired.

In this embodiment, and before each transmitted burst, the transmitter 10 is switched into the calibration mode. In the embodiment of FIG. 8 the input to the VGA 20 is made through the current-to-voltage converter 21A having differential outputs for driving quad 20A as well as the calibration-related transistor pair 20B. The calibration bjt pair 20B is switchably coupled to the current source 20C through the calibration switch 20D. Before calibration the reference voltage, Vref, is connected to the gain input of the temperature compensation block 18 via upper switch 21E. The feedback path 19 is implemented with bjt pair load resistors R and xR, differential amplifier 21B, calibration switch 28 and the capacitance 30 coupled to the temperature compensation block 18. As in the embodiment of FIG. 4A, Vref is held constant. In this embodiment, though, the output of the operational amplifier 21B varies until the voltage difference between xR and R is zero. Operational amplifier 21B charges the capacitance 30, and the voltage appearing on the capacitor 30 changes the bias of the temperature compensation block 20, causing the gain of the VGA 20 to change. The output of the operational amplifier 21B changes until the voltage difference between the resistors R and xR is zero, indicating that the output power is x-times smaller than the maximum output power. As in the embodiment of FIG. 4A, if the ratio of the resistors (x) is 40 dB, then the feedback loop adjusts the transmitter 10 so that with an input voltage of Vref the output power is always 40 dB (the ratio of the resistors (x)) lower than the maximum output power. During normal transmission the calibration circuit is turned off, meaning the calibration switch 28 is also opened, and the correct value of the calibration voltage output by amplifier 21B remains stored on the capacitance 30.

This embodiment is readily implemented with the temperature control block 18, which may be based on a multiplier (see FIG. 10), or with a temperature compensation block embodiment as illustrated in FIG. 9. The embodiment of FIG. 9 is conceptually simpler to implement, and consumes less power. The input voltage Vin or Vref is converted to a current in current-to-voltage converter 32, and is scaled down in bjt pair 34 by an amount dictated by the output of the feedback loop, as applied from capacitance 30 and buffer 36, via the base of transistor 34B.

Figure 10:
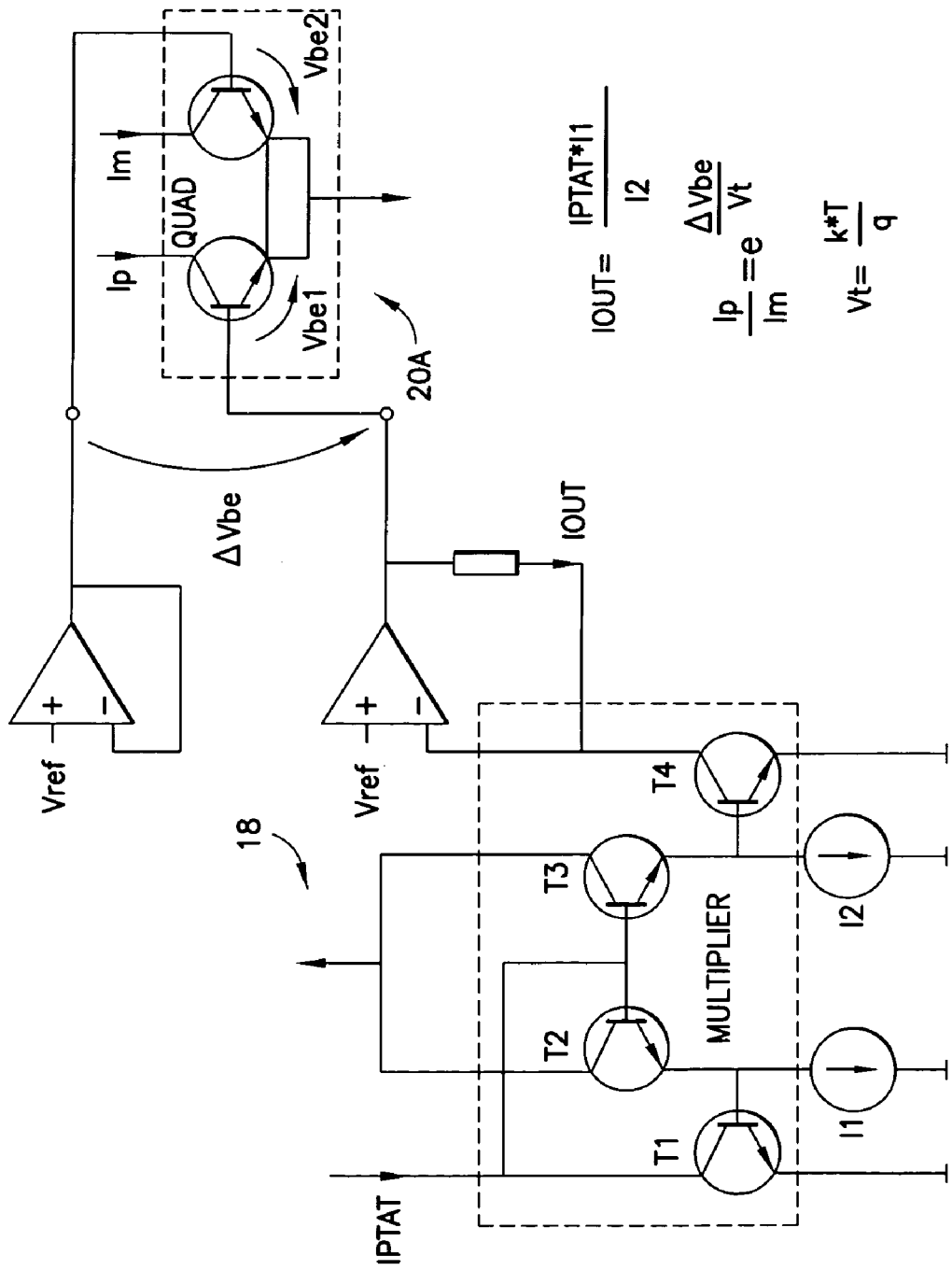
FIG. 10 is a circuit diagram that shows an embodiment of a multiplier-based temperature control block.

In the embodiment of FIG. 10 the temperature compensation block 18 and quad 20A driven by the temperature compensation block 18 are shown in greater detail. A multiplier (T1, T2, T3 and T4) executes the equation: IOUT=(IPTAT*I1)/I2. IPTAT is a current that is proportional to temperature. As such, current IOUT is proportional to temperature, i.e., the voltage ΔVbe is proportional to temperature. This is provided because the current driven through the quad 20A has the form $Ic=Is*e^{(\Delta Vbe/Vt)}$, where Is is one transistor parameter, and Vt=k*T/q, where T is temperature (k and q are constants). If ΔVbe is proportional to temperature, it compensates for the temperature variation of the quad 20A. Changing the current I1 or I2 changes the gain of the quad 20A.

For the purposes of this invention the bjt pair 20 and associated components, such as (depending on the embodiment) differential amplifier 21, load resistors R, xR, voltage-to-current converter 25B, bjt pair 26B, current-to-voltage converter 27, capacitance 30 and buffer 36, are all considered to form a part of the VGA 20, whether they be physically located with, or in association with, the VGA 20 components, such as the quad 20A. The same applies to the sampling node A and the differencing circuit 23 shown in FIG. 5. Thus, whatever bias signal is generated that is fed back to the temperature compensation block 18 is assumed, for convenience, to be generated by, and fed-back from, the VGA 20.

While this invention has been described in the context of several embodiments thereof, those skilled in the art should appreciate that the particular form and details of these embodiments are illustrative of the teachings of this invention, and are not to be construed in a limiting sense upon the practice of this invention.

What is claimed is:

1. A method to operate a variable gain amplifier (VGA), comprising:
   applying a gain control signal to the VGA through a temperature compensation block; and
   feeding back to the temperature compensation block a bias signal generated by the VGA, the bias signal operating to modify the gain control signal to reduce variability in a VGA gain slope over a range of VGA output power, wherein the bias signal is generated based on parameters established during a calibration procedure.

2. A method as in claim 1, where the bias signal is generated continuously.

3. A method as in claim 1, where the bias signal is generated periodically and is stored for use during operation of the VGA.

4. A method to operate a variable gain amplifier (VGA), comprising:
   applying a gain control signal to the VGA through a temperature compensation block; and
   feeding back to the temperature compensation block a bias signal generated by the VGA, the bias signal operating to modify the gain control signal to reduce variability in a VGA gain slope over a range of VGA output power where the bias signal is generated by a transistor pair that operates in parallel with a VGA transistor quad.

5. A method as in claim 4, where the transistor pair is driven by the same input signal circuit that drives the transistor quad.

6. A method as in claim 4, where the transistor pair is driven by a different input signal circuit than an input signal circuit that drives the transistor quad.

7. A method as in claim 4, where a first one of the transistors of the transistor pair has a load resistance given by R, where a second one of the transistors of the transistor pair has a load resistance given by xR, and where during a calibration procedure a signal is varied until the voltage difference between R and xR is substantially zero for indicating that the output power is x-times smaller than a maximum VGA output power.

8. A method as in claim 1, where the gain control signal is scaled by an amount specified by the bias signal that is fed back to the temperature compensation block.

9. A method as in claim 8, where a calibration reference signal is also scaled by an amount specified by the bias signal that is fed back to the temperature compensation block.

10. A method as in claim 1, where the bias signal comprises a signal generated from a sampled waste branch current of a VGA transistor quad.

11. An RF transmitter circuit comprising:
    a variable gain amplifier (VGA) comprising circuitry for generating a feedback signal; and
    a temperature compensation block having an input coupled to a gain control signal and an output coupled to an input of said VGA for providing to said VGA a compensated gain control signal, said temperature compensation block further comprising a bias input coupled to said VGA feedback signal, said VGA feedback signal operating to modify the gain control signal to reduce variability in a VGA gain slope over a range of VGA output power, wherein the feedback signal is generated based on parameters established during a calibration procedure.

12. An RF transmitter circuit as in claim 11, where the feedback signal is generated continuously.

13. An RF transmitter circuit as in claim 11, where the feedback signal is generated periodically and further comprising means for storing the feedback signal for use during operation of the VGA.

14. An RF transmitter circuit comprising:
    a variable gain amplifier (VGA) comprising circuitry for generating a feedback signal; and
    a temperature compensation block having an input coupled to a gain control signal and an output coupled to an input of said VGA for providing to said VGA a compensated gain control signal, said temperature compensation block further comprising a bias input coupled to said VGA feedback signal, said VGA feedback signal operating to modify the gain control signal to reduce variability in a VGA gain slope over a range of VGA output power where the feedback signal is generated by a transistor pair that operates in parallel with a VGA transistor quad.

15. An RF transmitter circuit as in claim 14, where the transistor pair is driven by the same input signal circuit that drives the transistor quad.

16. An RF transmitter circuit as in claim 14, where the transistor pair is driven by a different input signal circuit than an input signal circuit that drives the transistor quad.

17. An RF transmitter circuit as in claim 14, where a first one of the transistors of the transistor pair has a load resistance given by R, where a second one of the transistors of the transistor pair has a load resistance given by xR, and where during a calibration procedure a signal is varied until the voltage difference between R and xR is substantially zero for indicating that the output power is x-times smaller than a maximum VGA output power.

18. An RF transmitter circuit as in claim 11, where the gain control signal is scaled by an amount specified by the feedback signal.

19. An RF transmitter circuit as in claim 18, where a calibration reference signal is also scaled by an amount specified by the feedback signal.

20. An RF transmitter circuit as in claim 11, where the feedback signal comprises a signal generated from a sampled waste branch current of a VGA transistor quad.

21. A mobile station that comprises an RF transmitter circuit, said RE transmitter circuit comprising a variable gain amplifier (VGA) coupled between an up-conversion mixer and a power amplifier, said VGA receiving a gain control signal via a temperature compensation block, characterized by said VGA comprising circuitry for generating a feedback signal and said temperature compensation block comprising an input coupled to said feedback signal, said feedback signal operating to modify the gain control signal to reduce variability in a VGA gain slope over a range of VGA output power, wherein the feedback signal is generated based on parameters established during a calibration procedure.

22. A mobile station as in claim 21, where the feedback signal is generated continuously.

23. A mobile station as in claim 21, where said RF transmitter circuit transmits bursts of RF energy, and where the feedback signal is generated between a last burst and a next burst during the calibration procedure, and further comprising means for storing the feedback signal for use during the transmission of the next burst.

24. A mobile station that comprises an RF transmitter circuit, said RF transmitter circuit comprising a variable gain amplifier (VGA) coupled between an up-conversion mixer and a power amplifier, said VGA receiving a gain control signal via a temperature compensation block, characterized by said VGA comprising circuitry for generating a feedback signal and said temperature compensation block comprising an input coupled to said feedback signal, said feedback signal operating to modify the gain control signal to reduce variability in a VGA gain slope over a range of VGA output power where the feedback signal is generated in response to operation of a transistor pair that operates in parallel with a VGA transistor quad.

25. A mobile station that comprises an RF transmitter circuit, said RF transmitter circuit comprising a variable gain amplifier (VGA) coupled between an up-conversion mixer and a power amplifier, said VGA receiving a gain control signal via a temperature compensation block, characterized by said VGA comprising circuitry for generating a feedback signal and said temperature compensation block comprising an input coupled to said feedback signal, said feedback signal operating to modify the gain control signal to reduce variability in a VGA gain slope over a range of VGA output power where the feedback signal comprises a signal generated from a sampled waste branch current of a VGA transistor quad.

* * * * *